United States Patent
Tsai et al.

(10) Patent No.: US 6,512,710 B1
(45) Date of Patent: Jan. 28, 2003

(54) RELIABILITY TEST METHOD AND CIRCUIT FOR NON-VOLATILE MEMORY

(75) Inventors: Wen-Jer Tsai, Hualian (TW); Lan Ting Huang, Hsinchu (TW); Nian-Kai Zous, Tauyuan Hsien (TW); Ta-Hui Wang, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/004,636

(22) Filed: Dec. 4, 2001

(30) Foreign Application Priority Data

Aug. 2, 2001 (TW) ........................................ 90118849 A

(51) Int. Cl.[7] ................................................ G11C 7/00
(52) U.S. Cl. .............. 365/201; 365/230.06; 365/189.09
(58) Field of Search ............................ 365/201, 230.06, 365/189.09, 189.08, 191; 714/718

(56) References Cited

U.S. PATENT DOCUMENTS 5,999,466 A * 12/1999 Marr et al. ................. 365/201
6,005,815 A * 12/1999 Nakano .................. 365/189.08

\* cited by examiner

*Primary Examiner*—David Lam
(74) *Attorney, Agent, or Firm*—J.C. Patents

(57) ABSTRACT

A reliability test method for a non-volatile memory. A relation curve of gate voltage versus read current degradation rate is obtained. The read current degradation rate of an actual gate voltage is estimated. From the relation curve, an accelerated test gate voltage and a test time corresponding to the actual gate voltage are obtained. With the accelerated test gate voltage, the test is continuously performed within the test time. Afterward, a test result of the memory is then obtained and, by the result, it is judged whether the data is valid or not. If the data is right (retained), the memory can be guaranteed to have an expected lifetime; if the data is wrong (lost), the memory is judged as fails to pass the lifetime test.

6 Claims, 6 Drawing Sheets

RELIABILITY TEST METHOD AND CIRCUIT FOR NON-VOLATILE MEMORY

CROSS-REFERENCE TO RELATED APPLICATION

This application claims the priority benefit of Taiwan application Ser. No. 90/118849, filed Aug. 2, 2001.

BACKGROUND OF THE INVENTION

1. Field of the Invention

The invention relates in general to a test method and circuit for a non-volatile memory, and more particularly, to a test method and a test circuit for a non-volatile memory with a trapping layer.

2. Description of the Related Art

The gate structure of the non-volatile memory such as flash EEPROM has a control gate and a floating gate. The control gate is used to receive the operation voltage for controlling the memory cell, while the floating gate is used to store charges. With such a structure, as the floating gate is normally formed of a conductor such as polysilicon, the electrons injected for programming the memory cell distribute uniformly in the floating gate layer. The memory with such a floating gate structure can only function for one bit memory. Lately, memory with a dielectric layer to replace the floating gate has been proposed. Using the dielectric layer to trap electrons can cause a local distribution of the electrons. Two bits storage can be achieved to enhance the capacity of the memory cell.

FIG. 1 shows the structure of a non-volatile memory with a trapping layer capable of two bits storage. In FIG. 1, the ion implantation for forming the source 18 and drain 16 of the memory cell on a substrate is performed. A gate structure is on the substrate. The gate structure includes an oxide 10/nitride 12/oxide 14 structure. The nitride layer 12 is used as the trapping layer for electron capture. The techniques of channel hot electron injection and band-to-band hot hole injection are used for program and erase operations.

Since the trapping layer 12 is non-conductive, the electrons are localized at edges of the drain or the source of the memory cell while being trapped. That is, while applying the programming voltage to the gate and the drain, and a 0V to the source, a large electric field is generated between the gate and the drain edge. The electrons are trapped in the drain edge of the trapping layer 12 and localized therein. On the contrary, while applying the programming voltage to the gate and the source, and a 0V to the drain, a large electric field is generated between the gate and the source edge, and the electrons are trapped in the source edge of the trapping layer. Thereby, two bits storage can be achieved as shown as the locations of bit 1 and bit 2 in FIG. 1.

TABLE 1

|         |       | $V_g(V)$ | $V_s(V)$ | $V_d(V)$ | $V_b(V)$ |
|---------|-------|----------|----------|----------|----------|
| Program | Bit 1 | 10       | 4        | 0        | 0        |
|         | Bit 2 | 10       | 0        | 4        | 0        |
| Erase   | Bit 1 | -3       | +5       | Floating | 0        |
|         | Bit 2 | -3       | Floating | +5       | 0        |
| Read    | Bit 1 | 2.75     | 0        | 1.6      | 0        |
|         | Bit 2 | 2.75     | 1.6      | 0        | 0        |

It is found that, after the program/erase cycle (P/E cycle) of the memory cell, the threshold voltage in the erase state increases with the increase of the retention time. The increase in threshold voltage causes the decrease of read current, and eventually causes the data stored in the memory cell to be invalid. For example, a threshold voltage must be below a specific value, a stage "1" can be distinguished as "1". However, if the threshold voltage surpass the specific value, the stage "1" cannot be distinguished as "1" any more. That is, the data stored in the memory cell cannot be read correctly.

Therefore, to keep the memory working for a long time without failing after being produced, packaged, and held by the user, a test is required to ensure a normal operation even when the threshold voltage drifts. However, as the test time is limited, how to correctly and effectively predict the lifetime of the memory cell becomes a crucial task.

SUMMARY OF THE INVENTION

The invention uses the physical properties of the non-volatile memory with an insulating trapping layer to provide an effective test method and apparatus. The test method includes an accelerated test to estimate the lifetime of the memory cell within a short test time.

A reliability test method and apparatus are provided in the invention. An accelerated test is applied for a short test time, so as to determine whether a memory array can function normally within an estimated lifetime.

The reliability test method for a non-volatile memory includes the following steps. A relation curve of an applied gate voltage versus a read current degradation rate is determined. A read current degradation rate corresponding to an actual gate voltage is estimated. From the relation curve, an accelerated test gate voltage and a test time corresponding the actual gate voltage are obtained. With the applied accelerated test gate voltage, a test for a memory is performed continuously within the test time. Thereafter, each cell is read-out to judge whether the previously stored data is valid or not. If the data is right (retained), the memory can be guarantied to have an expected lifetime; if the data is wrong (lost), the memory is judged as fails to pass the lifetime test.

A quality test circuit for a non-volatile memory is also provided in the invention to test a memory array which comprises a plurality of memory cells arranged as a matrix of rows and columns. Each of the rows is coupled to a word line driver, and each of the columns is coupled to a bit line bias circuit. The quality test circuit of the non-volatile memory includes a word line bias generator coupled to the word line driver to input a word line voltage to perform the accelerated test.

Both the foregoing general description and the following detailed description are exemplary and explanatory only and are not restrictive of the invention, as claimed.

DESCRIPTION OF THE PREFERRED EMBODIMENTS

The threshold drift and read current drift of a non-volatile memory with an insulation trapping layer increases as the retention time of the memory increases. Such drift phenomena have a dependence on logarithm of the retention time. The invention uses the physical property of such drift to perform an accelerated test of reliability on the memory cell.

Figure 1:
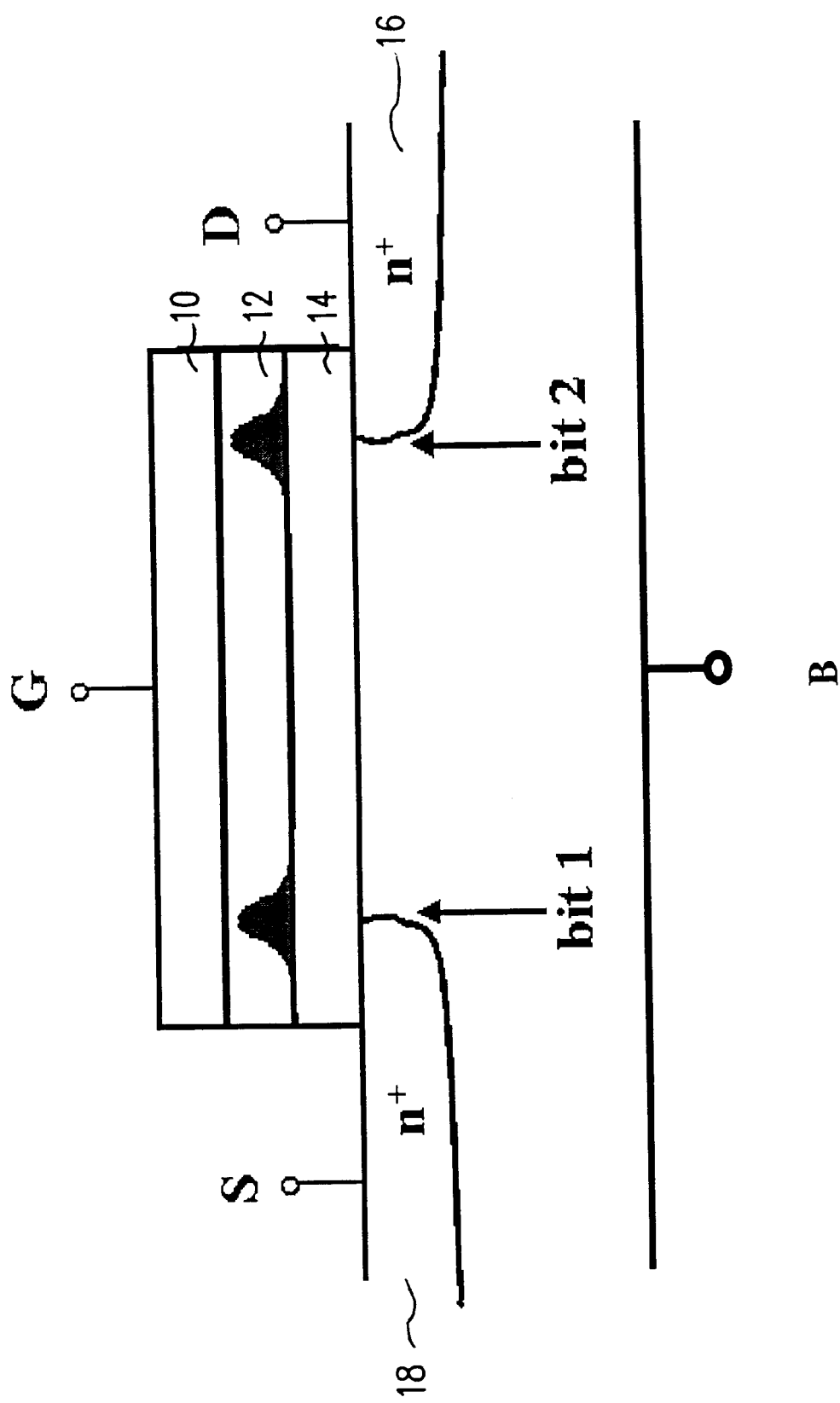
FIG. 1 shows a cross sectional view of a non-volatile memory with a trapping layer capable of storing two bits.
Figure 2:
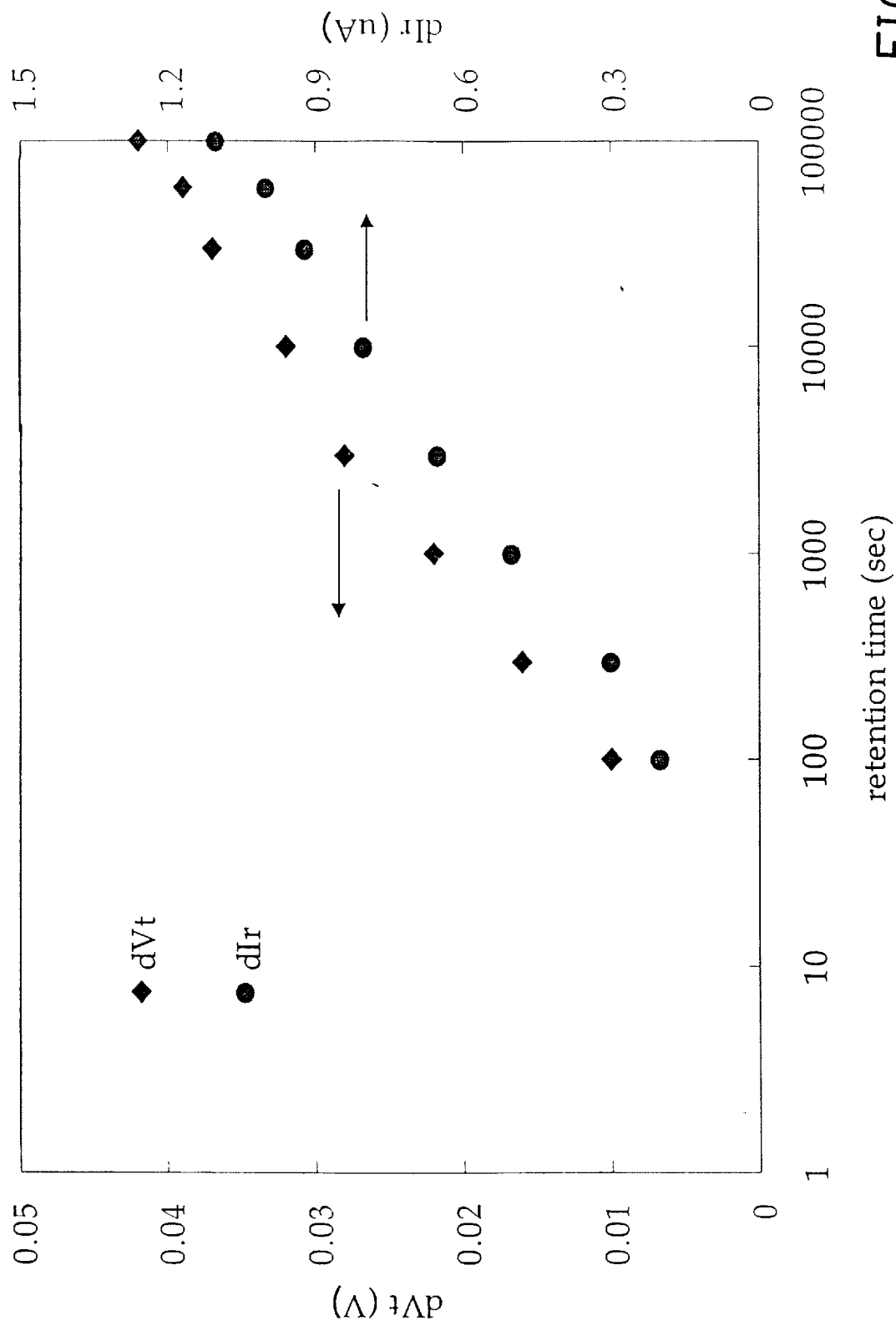
FIG. 2 shows the relationship between the threshold drift, the read current drift and the retention time.

FIG. 2 shows the relationship between the threshold drift, the read current drift and the retention time. When the retention time increases, as shown in FIG. 2, the threshold drift increases consequently. For example, when the retention time is 100 sec., the threshold drift dVt is about 0.01V. When the retention time increases up to 100000 sec., the threshold drift increases up to about 0.042V. That is, as the retention time increases, the threshold drift dVt increases from about 0.01V to about 0.042V, and a linear relationship is obtained. In addition, from FIG. 2, the read current drift also increases as the retention time increases. For example, when the retention time is 1 00 sec., the read current drift dIr is about 0.2 $\mu$A, and when the retention time increases up to 100000 sec., the read current drift increases up to about 1.1 $\mu$A. That is, as the retention time increases from 100 sec. to 100000 sec., the read current drift increases from about 0.2 $\mu$A to about 1.1 $\mu$A.

Figure 3:
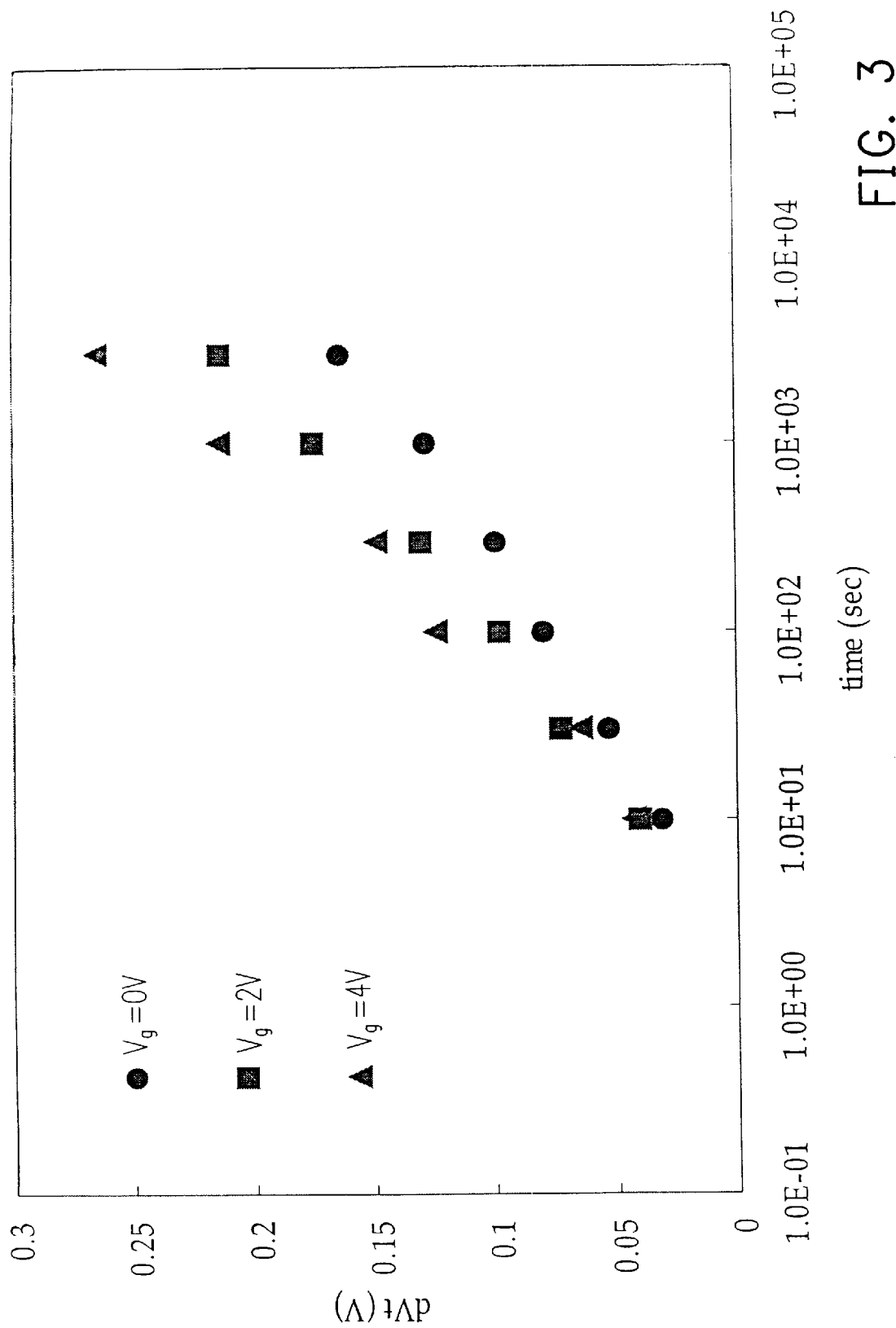
FIG. 3 shows the relationship between the threshold voltage drift and the retention time under various gate voltages.

From the experimental data, the threshold drift not only increases with the retention time, but is also affected by the magnitude of gate voltage Vg applied to the gate of the memory cell. FIG. 3 shows the relationship between the threshold drift and the retention time under various gate voltages.

As shown in FIG. 3, the relationship between the threshold drift and the retention time under gate voltage Vg of 0V, 2V, and 4V is illustrated. When the retention time is 10 sec., the threshold drifts corresponding to the three gate voltages are very similar. However, as the retention time increases, the difference in threshold drifts becomes more significant. For example, when the retention time is 1000 sec., the threshold drift dVt with respect to the gate voltages of 0V, 2V and 4V are about 0.12V, 0.175V and 0.2V, respectively. Therefore, as the gate voltage Vg increases, the increment of threshold drift dVt as a function of the retention time becomes more significant.

According to the above physical property, the threshold drift and the read current drift are used as a reference for the reliability test in the invention.

Figure 4:
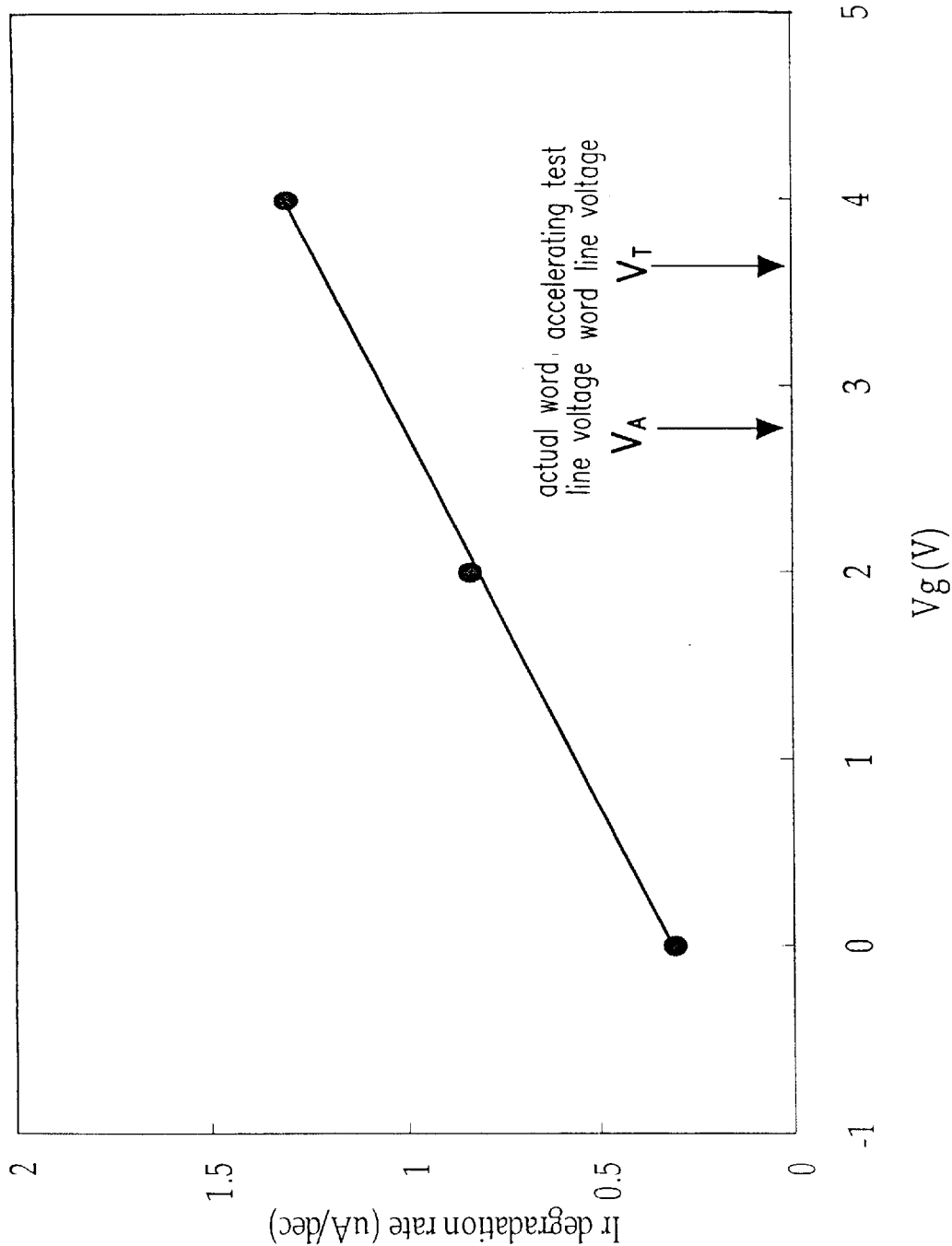
FIG. 4 shows the relation between the applied gate voltage and the read current degradation rate.

FIG. 4 shows a relation curve between the gate voltage and the read current degradation rate ($\mu$A/dec). A linear relationship is observed from FIG. 4. In addition, in FIG. 4, based on a product with a lifetime of 10 years, approximately a 1.3 times read current degradation rate is necessary for 1000 hours of product reliability test time. We apply an equation to explain why the 1.3 times read current degradation rate is necessary. The equation is shown as follows.

$$I_A (VA)*\log[T_A]=I_T(VT)*\log[T_T]$$

wherein $I_A$ is the actual read current degradation rate with an actual word line voltage $V_A$;

$I_T$ is the accelerated read current degradation rate with an accelerated test word line voltage $V_T$;

$T_A$ is a lifetime of a memory; and $T_T$ is a test time of a memory.

As shown in the equation, we suppose that the lifetime of a memory ($T_A$) is 10 years (about $3.15*10^8$ seconds) and the test time of a memory ($T_T$) is 1000 hours (about $3.6*10^6$ seconds). Accordingly, we obtain the relation, $I_A(V_A)/I_T(V_T)$=1.3.

In FIG. 4, we further suppose that an actual word line voltage ($V_A$), for a product with a 10 years lifetime, is 2.75V. Therefore, the corresponding read current degradation rate is 1.0 $\mu$A/dec. In addition, the test time of a memory ($T_T$) is 1000 hours. By the above equation, the accelerated test word line voltage is about 3.58V with the read current degradation rate of 1.3 $\mu$A/dec. Consequently, we can apply the accelerated test word line voltage (3.58V) for 1000 hours to perform a testing process. That is, if a test result with the accelerated word line voltage is satisfied, it is confirmed that the memory cell fulfills the lifetime under the actual operation condition without failing.

Figure 5:
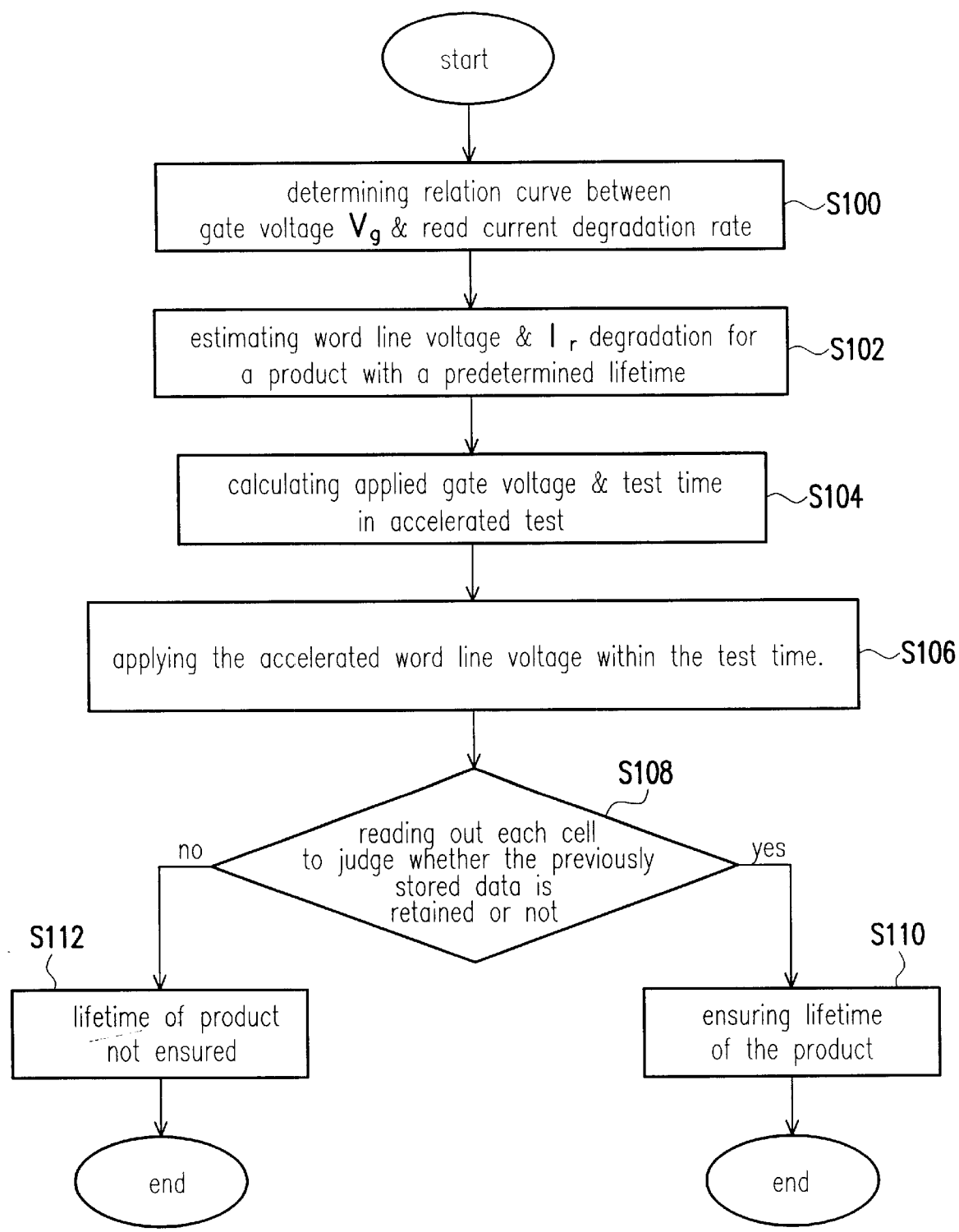
FIG. 5 shows a flow chart of the reliability test method for a non-volatile memory according to the invention.

FIG. 5 shows a flow chart of the above method. In step S100, the relation curve between the applied gate voltage (word line voltage) and the read current degradation rate is determined, for example, the relation curve in FIG. 4.

In step S102, a gate voltage of a memory cell with a predetermined lifetime is estimated. For example, lifetime of a memory cell be necessarily longer than 10 years with the actual word line voltage $V_A$ of 2.75V. In step S104, the accelerated test word line voltage and the test time in response to the actual gate voltage are obtained from the graph obtained in step S100. For example, $V_T$=3.58V, and the test time is 1000 hours.

In step S106, with the applied accelerated test word line voltage of $V_T$=3.58V, a test for a memory is performed continuously within 1000 hrs. Each cell is then read-out to judge whether the previously stored data is valid or not. If the data is right (retained), the memory can be guarantied to have an expected lifetime; if the data is wrong (lost), the memory is judged as fails to pass the lifetime test.

According to the above, the accelerated test method can accurately and effectively estimate the lifetime of the product.

Figure 6:
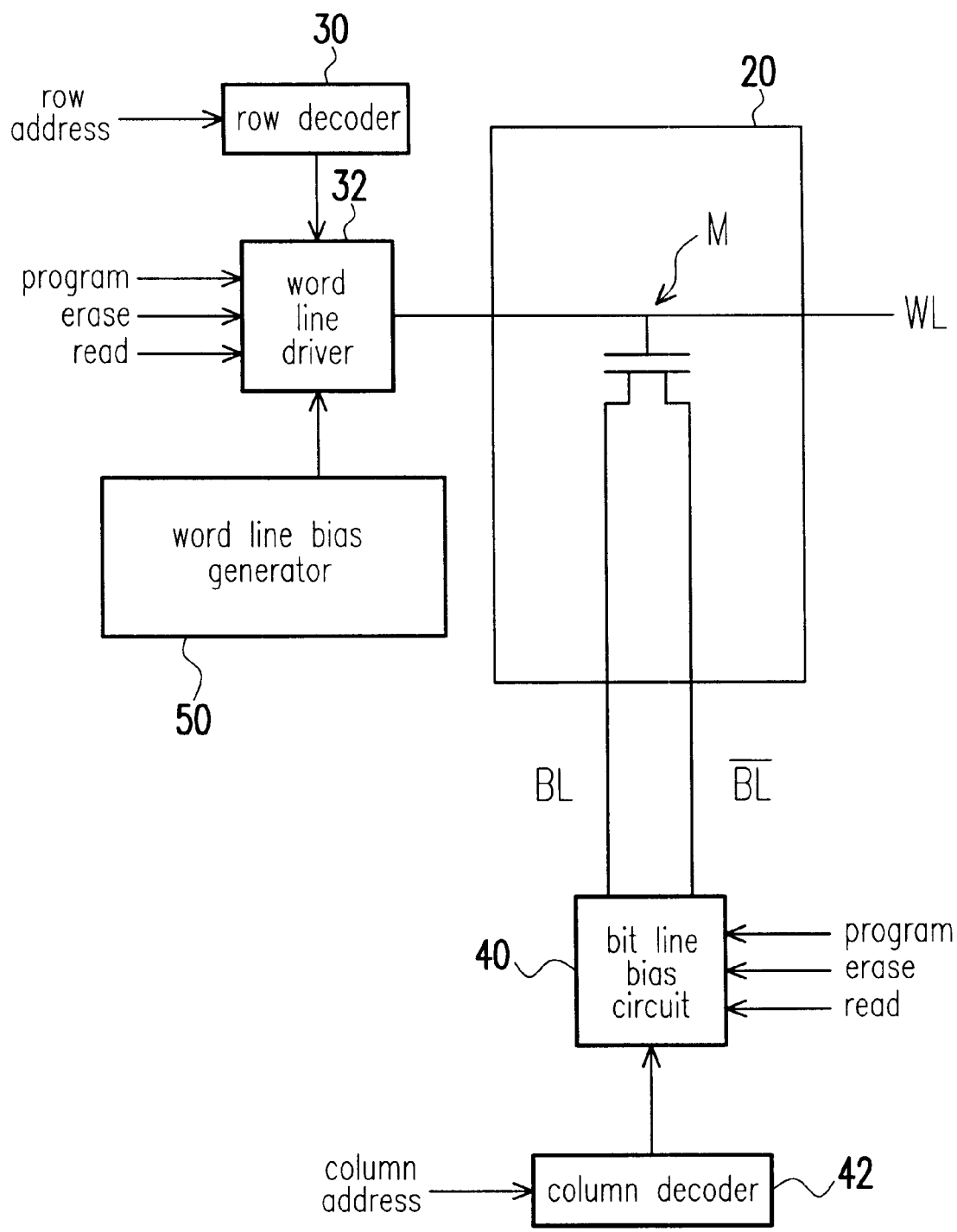
FIG. 6 shows a circuit diagram for implementing the reliability test for non-volatile memory.

FIG. 6 shows a circuit to perform a quality test method for a non-volatile memory. As shown in FIG. 6, a memory cell M of a flash memory array 20 is illustrated as an example. It is known to one of ordinary skill in the art that the memory array 20 comprises a plurality of memory cells arranged as a matrix with a plurality of columns (bit lines, connected to the source regions of the memory cells in the same column) and rows (word lines, connected to the gates of the memory cells in the same row). The circuit has a word line driver 32 coupled to each word line WL to provide the program, erase and read voltage to the gate of the memory cell. A row decoder 30 is coupled to the word line driver 32 to receive a row address which is transmitted to the word line driver 32 after being decoded. The decoded row address is further connected to the memory cell at the selected row address (word line). A bit line bias circuit 40 is coupled to each bit line BL to provide program, erase and read voltage to the memory cell. A column decoder 42 is coupled to the bit line bias circuit 40 to receive a column address. Being decoded, the column address is transmitted to the bit line bias circuit 40, and a bias is provided to the memory cell at a selected column address (bit line) via the bit line bias circuit 40.

A word line bias generator 50 is coupled to the word line driver 32 to input a word line voltage for performing the accelerated test. For example, using the above example, the accelerated test word line voltage $V_T$=3.58V is applied as the word line voltage for the accelerated test. After 1000 hours of test, each cell is read-out to judge whether the previously stored data is valid or not. If the data is right (retained), the memory can be guarantied to have an expected lifetime; if the data is wrong (lost), the memory is judged as fails to pass the lifetime test.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A reliability test method for a non-volatile memory, comprising:
   obtaining a relation curve for gate voltage versus read current degradation rate;
   estimating an actual gate voltage and a read current degradation rate corresponding to the actual gate voltage;
   obtaining an accelerated test gate voltage and a test time corresponding to the actual gate voltage;
   applying the accelerated test gate voltage, performing a test within the test time; and;
   reading out each cell to judge whether the previously stored data is retained or not;
   wherein if the data is right (retained), the memory can be guaranteed to have an expected lifetime and, if the data is wrong (lost), the memory is judged as fails to pass the lifetime test.

2. The reliability test method according to claim 1, wherein the relation curve is linear.

3. A quality test method for a non-volatile memory, comprising:
   obtaining a relation curve between a gate voltage and a read current degradation rate;
   estimating an actual gate voltage and a read current degradation rate corresponding thereto according to the relation curve;
   obtaining an accelerated test gate voltage and a test time corresponding to the actual gate voltage; and
   continuously performing a test within the test time by applying the accelerated test gate voltage, thereafter reading out each cell to judge whether the previously stored data is valid or not in order to determine if the non-volatile memory cell has a predetermined lifetime in response to the actual gate voltage.

4. The quality test method according to claim 3, wherein the relation curve is linear.

5. A quality test circuit for a non-volatile memory, to test a memory array that comprises a plurality of memory cells arranged as a matrix with a plurality of rows and a plurality of columns, wherein each row is coupled to a word line driver, and each column is coupled to a bit line bias circuit the circuit comprising:
   a word line bias generator coupled to the word line driver to input a word line voltage to perform an accelerated test,
   wherein the word line voltage is determined according to a relation curve for a gate voltage versus a read current degradation rate by setting an accelerated gate voltage of a preset life time.

6. A non-volatile memory circuit with a quality test circuit, comprising:
   a memory array, having a plurality of memory cells arranged in a plurality of rows and columns;
   a word line driver, coupled to the rows to drive the rows;
   a bit line bias circuit, coupled to the columns to drive the columns; and
   a word line bias generator, coupled to the word line driver to input a word line voltage to perform an accelerated test, wherein the word line voltage is determined according to a relation curve for a gate voltage versus a read current degradation rate by setting an accelerated gate voltage of a preset life time.

* * * * *